United States Patent
Park (10) Patent No.: US 9,202,796 B2
(45) Date of Patent: Dec. 1, 2015

(54) SEMICONDUCTOR PACKAGE INCLUDING STACKED CHIPS AND A REDISTRIBUTION LAYER (RDL) STRUCTURE

(71) Applicant: SAMSUNG ELECTRONICS CO., LTD., Suwon-Si, Gyeonggi-Do (KR)

(72) Inventor: Ji-Woon Park, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 325 days.

(21) Appl. No.: 13/798,444

(22) Filed: Mar. 13, 2013

(65) Prior Publication Data

US 2014/0210108 A1 Jul. 31, 2014

(30) Foreign Application Priority Data

Jan. 31, 2013 (KR) .......................... 10-2013-0011339

(51) Int. Cl.
*H01L 23/02* (2006.01)
*H01L 23/00* (2006.01)
*H01L 25/065* (2006.01)

(52) U.S. Cl.
CPC ............... *H01L 24/49* (2013.01); *H01L 24/06* (2013.01); *H01L 25/0657* (2013.01); *H01L 24/05* (2013.01); *H01L 24/48* (2013.01); *H01L 2224/05554* (2013.01); *H01L 2224/4813* (2013.01); *H01L 2224/48091* (2013.01); *H01L 2224/48145* (2013.01); *H01L 2224/49175* (2013.01); *H01L 2924/00014* (2013.01); *H01L 2924/19107* (2013.01)

(58) Field of Classification Search
CPC .............. H01L 23/49; H01L 2224/023; H01L 2224/0233; H01L 2224/0237
See application file for complete search history.

(56) References Cited

U.S. PATENT DOCUMENTS

| | | | |
|---|---|---|---|
| 5,012,323 A * | 4/1991 | Farnworth | 257/723 |
| 6,876,069 B2 | 4/2005 | Punzalan et al. | |
| 7,071,487 B2 | 7/2006 | Maruyama | |
| 7,145,224 B2 | 12/2006 | Kawashima et al. | |
| 7,170,160 B1 | 1/2007 | Wang | |
| 7,239,028 B2 | 7/2007 | Anzai | |
| 7,560,304 B2 | 7/2009 | Takiar et al. | |
| 7,576,431 B2 * | 8/2009 | Takahashi | 257/777 |
| 7,705,433 B2 * | 4/2010 | Lee et al. | 257/659 |
| 7,746,719 B2 | 6/2010 | Kang | |
| 7,772,047 B2 | 8/2010 | Liao et al. | |
| 7,948,071 B2 | 5/2011 | Thomas et al. | |
| 8,053,898 B2 * | 11/2011 | Marcoux | 257/773 |
| 8,076,164 B1 | 12/2011 | Briggs | |

(Continued)

FOREIGN PATENT DOCUMENTS

KR 1020030042152 A 5/2003
KR 1020110056768 A 5/2011

*Primary Examiner* — Ida M Soward
(74) *Attorney, Agent, or Firm* — Volentine & Whitt, PLLC (57) ABSTRACT

A semiconductor package offers improved product reliability by supplying a power voltage and a ground voltage to a semiconductor chip in a secured manner using a redistribution layer (RDL) structure. The semiconductor package includes a first semiconductor chip disposed on a substrate, a second semiconductor chip disposed on the first semiconductor chip, a plurality of redistribution lines disposed on the first semiconductor chip and electrically connecting the first semiconductor chip to the second semiconductor chip, and a redistribution wire disposed on the first semiconductor chip and electrically connecting one of the redistribution lines to another.

20 Claims, 11 Drawing Sheets

(56) References Cited

U.S. PATENT DOCUMENTS

| | | | |
|---|---|---|---|
| 8,299,627 B2 * | 10/2012 | Kim et al. | 257/777 |
| 8,324,725 B2 * | 12/2012 | Khandros et al. | 257/723 |
| 8,331,121 B2 * | 12/2012 | Hong | 365/51 |
| 8,456,856 B2 * | 6/2013 | Lin et al. | 361/783 |
| 8,611,125 B2 * | 12/2013 | Hong | 365/51 |
| 2006/0001792 A1 * | 1/2006 | Choi | 349/54 |
| 2009/0243069 A1 * | 10/2009 | Camacho et al. | 257/686 |
| 2010/0149770 A1 | 6/2010 | Park et al. | |
| 2010/0172609 A1 * | 7/2010 | Rolston et al. | 385/14 |
| 2010/0270689 A1 | 10/2010 | Kim et al. | |
| 2010/0329042 A1 | 12/2010 | Seong | |
| 2011/0147949 A1 * | 6/2011 | Karp et al. | 257/777 |
| 2012/0049375 A1 * | 3/2012 | Meyer et al. | 257/773 |
| 2012/0080806 A1 * | 4/2012 | Song et al. | 257/777 |
| 2013/0161788 A1 * | 6/2013 | Chun et al. | 257/532 |
| 2014/0145352 A1 * | 5/2014 | Kim et al. | 257/777 |
| 2015/0129190 A1 * | 5/2015 | Lin | 257/777 |

* cited by examiner

SEMICONDUCTOR PACKAGE INCLUDING STACKED CHIPS AND A REDISTRIBUTION LAYER (RDL) STRUCTURE

PRIORITY STATEMENT

This application claims priority from Korean Patent Application No. 10-2013-0011339 filed on Jan. 31, 2013 in the Korean Intellectual Property Office, and all the benefits accruing therefrom under 35 U.S.C. 119, the contents of which are hereby incorporated by reference in their entirety.

BACKGROUND

1. Field of the Inventive Concept

The present inventive concept relates to a semiconductor package. In particular, the present inventive concept relates to a multi-chip semiconductor package in which a plurality of chips are stacked one atop the other.

2. Description of the Related Art

One way to meet current demand for compact and high-capacity semiconductor-based products is to provide a highly integrated semiconductor chip. However, today's integration techniques impose limits on the degree to which a semiconductor chip can be integrated without otherwise incurring enormous expenses. Therefore, a multi-chip type of semiconductor package, in which electrically connected semiconductor chips are stacked and united in a single package, has been developed.

However, as the number of stacked semiconductor chips to be provided in a multi-ship semiconductor package increases, it becomes more and more difficult to connect (the signals lines of) the semiconductor chips. One means used to facilitate the electrical connection of a large number of stacked semiconductor devices is a redistribution layer (RDL).

SUMMARY

There is provided a semiconductor package comprising a first semiconductor chip, a second semiconductor chip disposed on the first semiconductor chip, redistribution lines constituting an RDL structure extending on the first semiconductor chip, and at least one redistribution wire disposed on the first semiconductor chip and electrically connecting a plurality of the redistribution lines to one another.

The redistribution lines provide conductive paths, respectively, each of which electrically connects the first semiconductor chip to the second semiconductor chip independently of the other.

According to another aspect of the inventive concept, the redistribution lines include a plurality of first redistribution lines electrically connecting the first semiconductor chip to the second semiconductor chip to supply a first voltage to the first semiconductor chip, a plurality of second redistribution lines electrically connected to the second semiconductor chip to supply the first voltage to the second semiconductor chip, and a plurality of third redistribution lines electrically connected to the second semiconductor chip to supply the first voltage to the second semiconductor chip, and a plurality of the redistribution wires are provided. The redistribution wires include a first redistribution wire electrically connecting one of the first redistribution lines to another of the first redistribution lines, a second redistribution wire electrically connecting one of the second redistribution lines to another of the second redistribution lines, and third redistribution wires electrically connecting the first redistribution line, the second redistribution line and the third redistribution line to one another.

According to another aspect of the present inventive concept, there is provided a semiconductor device comprising a first semiconductor chip including a first chip body having an upper surface at the top of the device, a second semiconductor chip stacked on the first semiconductor chip so as to also be located at the top of the device and including a second chip body adhered to the first chip body, redistribution lines extending over the upper surface of the first chip body, and at least one redistribution wire running alongside the upper surface of the first chip body. The redistribution lines provide conductive paths, respectively, each of which paths electrically connects the first semiconductor chip to the second semiconductor chip independently of the other, and each redistribution wire electrically connects two of the redistribution lines to one another.

BRIEF DESCRIPTION OF THE DRAWINGS

The above and other features and advantages of the present inventive concept will become more apparent with reference to the detail description that follows of preferred embodiments thereof made with reference to the attached drawings in which.

DETAILED DESCRIPTION OF THE PREFERRED EMBODIMENTS

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Furthermore, throughout the specification reference may be made to an individual element, e.g., line or pad, for ease of description when it is nonetheless clear that the description refers to a plurality of like elements.

It will also be understood that when an element or layer is referred to as being "on" or "connected to" or "adhered" to another element or layer, it can be directly on, connected or adhered to the other element or layer or intervening elements or layers may be present. In contrast, when an element or layer is referred to as being "directly on" or "directly connected to" or "directly adhered to" another element or layer, there are no intervening elements or layers present.

Furthermore, spatially relative terms, such as "upper" and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term "connected" will generally refer to an electrical connection even when not expressly stated but as the context will make clear. The term "extends" or "runs" will generally refer to the longitudinal or lengthwise direction of the element, such as a wire, being described.

Hereinafter, a first embodiment of a semiconductor package according to the inventive concept will be described with reference to FIGS. 1 to 4.

The semiconductor package includes a substrate 110, at least one first semiconductor chip 120, a second semiconductor chip 160, a plurality of redistribution lines 200 and first redistribution wires 214.

The substrate 110 may be any of various types of substrates, such as a printed circuit board, a flexible substrate, or a tape substrate. In any case, the substrate 110 includes a substrate body (e.g., a body of insulating material) and bonding pads 112 on the top surface of the substrate body. For example, the body of the substrate 110 may include an insulating layer of material such as a liquid crystal polymer (LCP), polycarbonate, or polyphenylsulfide. The substrate 110 may also have external electrical contacts on the bottom surface of the substrate body, and an internal circuit embedded within the insulating body and by which the bonding pads 112 are connected to the external electrical contacts.

Furthermore, the substrate bonding pads 112 are electrically connected to the first semiconductor chip 120 by bonding wires 114. The exact number and arrangement of substrate bonding pads 112 and bonding wires 114, however, may depend on the type and application of the semiconductor package. That is, the inventive concept does is not limited to any particular number and arrangement of substrate bonding pads 112 and bonding wires 114.

The at least one first semiconductor chip 120 is disposed on the substrate 110. In this respect, the at least one first semiconductor chip 120 may disposed on a region of the substrate 110 that is devoid of the substrate bonding pads 112. In the illustrated example, the at least one first semiconductor chip 120 includes a plurality of first semiconductor chips, namely, a first sub semiconductor chip 130, a second sub semiconductor chip 140 and a third sub semiconductor chip 150 stacked vertically one on the other on the substrate 110. Furthermore, and although not shown, the substrate 110 and the sub semiconductor chips 130, 140 and 150 are adhered to each other by adhesive interposed therebetween. However, note, the present embodiment is not limited to any particular number of stacked sub semiconductor chips.

The sub semiconductor chips 130, 140 and 150 comprise chip bodies (e.g., semiconductor substrates) and bonding pads 132, 142 and 152 on top surfaces of the chip bodies, respectively. The semiconductor package also has bonding wires 134 and 144 connecting the bonding pads 132, 142 and 152 to each other. In the illustrated example, the bonding pads 132, 142 and 152 are all disposed at the same side of the package. In particular, the bonding pads 132 are disposed along one side of the top of the first sub semiconductor chip 130, the bonding pads 142 are disposed along one side of the top of the second sub semiconductor chip 140 stacked on the first sub semiconductor chip 130, the bonding pads 152 are disposed along one side of the top of the third sub semiconductor chip 150 stacked on the second sub semiconductor chip 140, the bonding wires 134 directly connect the bonding pads 132 of the first sub semiconductor chip 130 to the bonding pads 142 of the second sub semiconductor chip 140, and the bonding wires 144 directly connect the bonding pads 142 of the second sub semiconductor chip to the bonding pads 152 of the third sub semiconductor chip 150. The semiconductor package similarly has bonding wires 114 directly connecting the bonding pads 132 of the first sub semiconductor chip 130 to the substrate bonding pads 112.

Each of the sub semiconductor chips 130, 140, 150 includes integrated circuitry (an IC), and the bonding pads 132, 142, 152 of each sub semiconductor chip may be electrically connected to the integrated circuitry of the chip (through vias in the chip body, for example) similar to the way in which the bonding pads 112 of the substrate 110 my be connected to the internal circuit of the substrate 110.

Also, the at least one first semiconductor chip 120 may be stacked as offset from the edge of the substrate 110 adjacent which the substrate bonding pads 112 are located so as to expose the substrate bonding pads 112. Further in this respect, the sub semiconductor chips may also be positioned on the substrate 110 such that the bonding pads 132, 142 and 152 are disposed along the same side of the package as the substrate bonding pads 112. In this case, the bonding wires 114, 134 and 144 maybe relatively short, and connected to the pads 112, 132, 142 and 152 in a simple pattern. Thus, the possibility of a loop failure or short circuit of the bonding wires 114, 134 and 144 is minimized. Note, however, the numbers and arrangements of the bonding pads 132, 142 and 152 and the bonding wires 134 and 144 shown in the drawings are provided only for illustrative purposes only.

Furthermore, each at least one first semiconductor chip 120 may be a memory chip or a logic chip. If a memory chip, the chip may include any of various types of memory devices, e.g., a DRAM, SRAM, flash memory, PRAM, ReRAM, FeRAM or MRAM constituting its circuit. Thus, the circuit of each first semiconductor chip 120 may comprise a memory cell.

The multi-chip package also includes a second semiconductor chip 160 disposed on the first semiconductor chip 120. In one example of this embodiment, the second semiconductor chip 160 has a smaller footprint than the first semiconductor chip 120 on which it is directly stacked (in this example, a smaller footprint than at least the third sub semiconductor chip 150), and is disposed closer to one side of the first semiconductor chip 120 than the other sides of the chip 120.

The second semiconductor chip 160 may be a controller. That is, the first semiconductor chip 120 may be controlled by the second semiconductor chip 160. For example, if the first semiconductor chip 120 is a memory chip and the second semiconductor chip 160 is a controller, the second semiconductor chip 160 supplies power to the first semiconductor chip 120 and transfers signals to the first semiconductor chip 120 to perform write, erase and read operations on the first semiconductor chip 120.

The second semiconductor chip 160 has a chip body (e.g., a semiconductor substrate), and second semiconductor chip bonding pads 161 disposed on the chip body of the second semiconductor chip 160. The second semiconductor chip bonding pads 161 are connected to the redistribution lines 200 via second semiconductor chip bonding wires 154. The second semiconductor chip 160 may be connected to the first semiconductor chip 150 or other active or passive elements (not shown) through the second semiconductor chip bonding pad 161.

The second semiconductor chip bonding pads 161 may include a power output pad unit 162 (i.e., a pad or pads of a power output unit of the second semiconductor chip 160), and likewise an output ground pad unit 164, a signal pad unit 166, a voltage regulator ground pad unit 167 and a second semiconductor chip ground pad unit 168.

That is, the power output pad unit 162 includes at least one pad by which the second semiconductor chip 160 supplies a power voltage to the first semiconductor chip 120, and the output ground unit 164 includes at least one pad by which the second semiconductor chip 160 supplies a ground voltage to the first semiconductor chip 120. In this respect, the second semiconductor chip 160 may include a voltage regulator 270. The voltage regulator 270 receives an external voltage and generates a voltage having a predetermined magnitude (e.g., 1.8 V) then supplies the generated voltage to the first semiconductor chip 120. The voltage output pad unit 162 and the output ground pad unit 164 are connected to the voltage regulator 270 to supply the voltage to the first semiconductor chip 120.

The voltage regulator ground pad unit 167 includes at least one pad connected to an input ground of the voltage regulator 270, and the second semiconductor chip ground pad unit 168 includes at least one pad connected to a ground of the second semiconductor chip 160.

The signal pad unit 166 includes at least one pad for transmitting signals between the first semiconductor chip 120 and the second semiconductor chip 160 that cause read, write or erase operations to be executed with respect to the memory device(s) of the first semiconductor chip 120.

In FIGS. 1 to 4, the second semiconductor chip 160 is shown as including three power output pads 162a, 162b and 162c, three output ground pads 164a, 164b and 164c and three signal pads 166a, 166b and 166c, but the present inventive concept is not limited to pad units of these numbers of pads. For example, the power output pad unit 162, the output ground pad unit 164 and the signal pad unit 166 may each include more than three pads. In addition, the pads that constitute the power output pad unit 162, the output ground pad unit 164 and the signal pad unit 166 are shown as alternately disposed with respect to one another at the top of the second semiconductor chip 160 and all arranged along one line, but again the present inventive concept is not limited to such specifics.

In addition, the second semiconductor chip 160 of this embodiment is shown as having two voltage regulator ground pads 167a and 167b and one second semiconductor chip ground pad 168. However, the voltage regulator ground pad unit 167 may include more than two voltage regulator ground pads, and the second semiconductor chip ground pad unit 168 may include a plurality of second semiconductor chip ground pads.

The redistribution lines 200 extend along a surface of a chip body of the at least one first semiconductor chip 200. In particular, the redistribution lines 200 are disposed on the uppermost most one of the chips that constitutes the at least one first semiconductor chip 200, in this case, the third sub semiconductor chip 150. In the illustrated embodiment, 12 redistribution lines 200 are provided by way of example only. The redistribution lines 200 electrically connect (circuits of) the first semiconductor chip 120 and the second semiconductor chip 160 to each other.

In this embodiment, the redistribution lines 200 include at least one each of first to fifth redistribution lines 210, 220, 230, 240 and 250. Reference, at first, will be made to individual ones of the first to fifth redistribution lines 210, 220, 230, 240 and 250.

The first redistribution line 210 is electrically connected to the power output pad unit 162 of the second semiconductor chip 160 (i.e., the first redistribution line is a power line in this example), the second redistribution line 220 is electrically connected to the output ground pad unit 164 of the second semiconductor chip 160, the third redistribution line 240 is electrically connected to the voltage regulator ground pad unit 167 of the second semiconductor chip 160, the fourth redistribution line 250 is electrically connected to the second semiconductor chip ground pad unit 168 of the second semiconductor chip 160, and the fifth redistribution line 230 is electrically connected to the signal pad unit 166 of the second semiconductor chip 160. The first redistribution line 210, the second redistribution line 220 and the fifth redistribution line 230 may extend parallel to each other but this may depend on the arrangement of the pads constituting the power output pad unit 162, the output ground pad unit 164 and the signal pad unit 166 of the second semiconductor chip 160, which arrangement is shown for illustrative purposes only.

Figure 3:
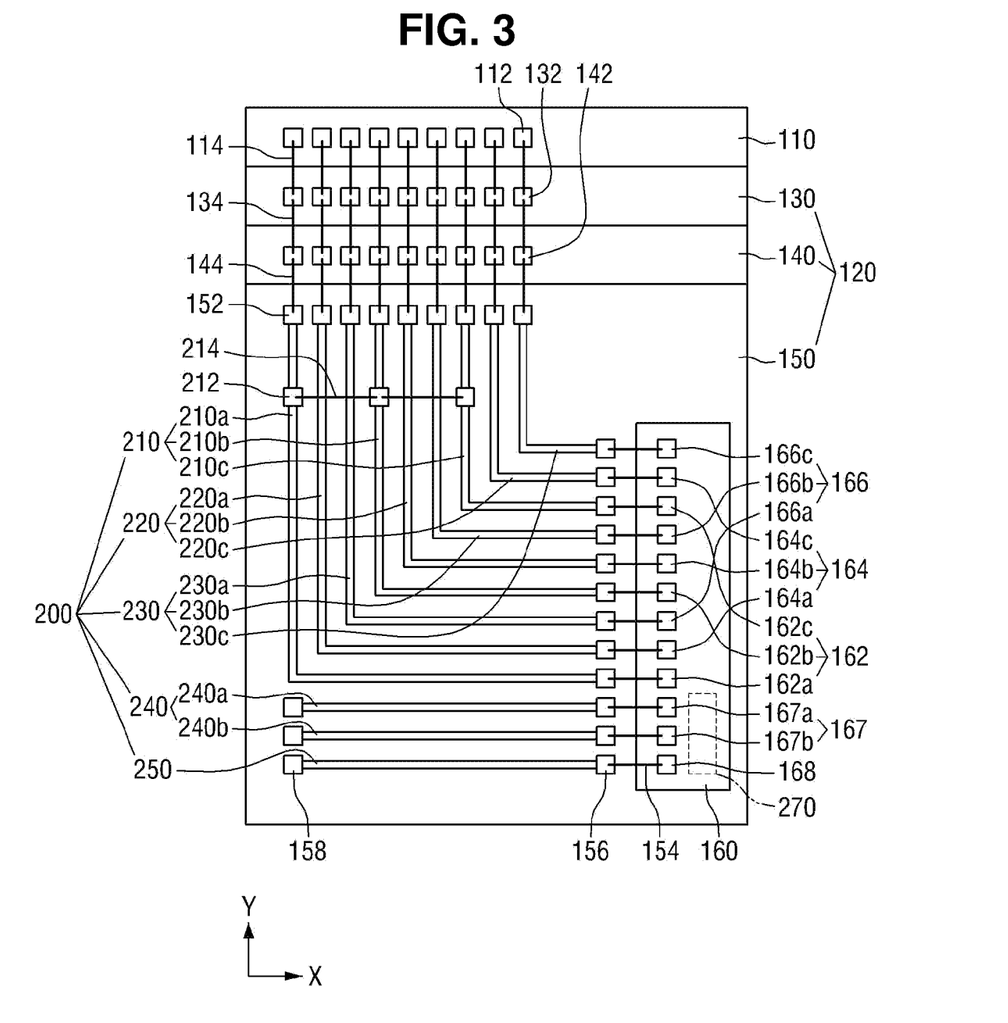
FIG. 3 is a plan view of the semiconductor package shown in FIG. 1.

As best shown in FIG. 3, each of the redistribution lines 200 may extend in a first direction (e.g., in the x-axis direction) and/or in a second direction that is at an angle with respect to the first direction (e.g., in the y-axis direction orthogonal to the x-axis direction). In the specific example shown in FIGS. 1 and 3, some of the redistribution lines 200, for example, the first, second and fifth redistribution lines 210, 220 and 230 extend in the first direction and the second direction, and the third redistribution line 240 and the fourth redistribution line 250 extend only in the first direction.

Figure 1:
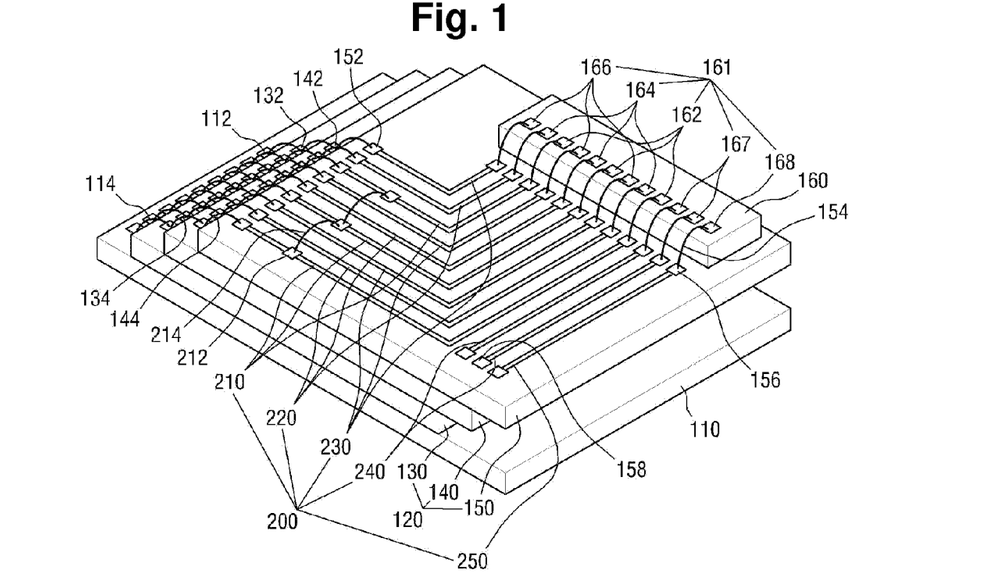
FIG. 1 is a perspective view of a first embodiment of a semiconductor package according to the present inventive concept.
Figure 2:
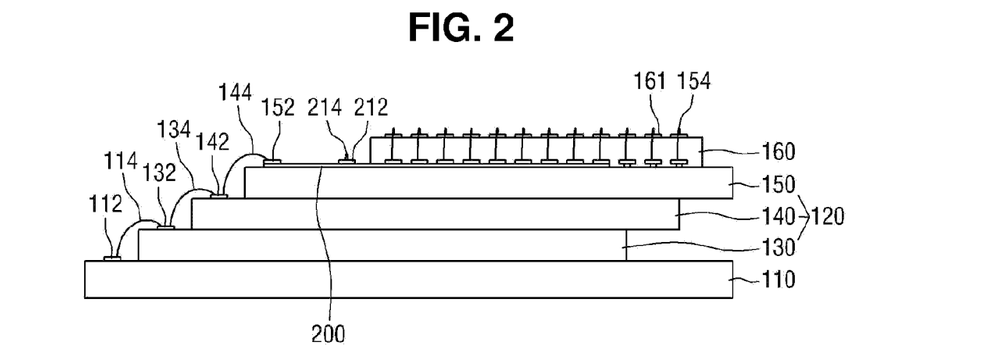
FIGS. 2 and 4 are side views of the semiconductor package shown in FIG. 1.

Referring still to FIGS. 1 and 3, the redistribution lines 200 electrically connect the at least one first semiconductor chip 120 and the second semiconductor chip 160. To this end, bonding pads 152, 156 and 158 may be provided at the ends of the redistribution lines 200.

The bonding pads 156 are provided at the ends of the redistribution lines 200 closest to the second semiconductor chip 160, and are electrically connected to the second semiconductor chip 160 through second semiconductor chip bonding wires 154. The first redistribution line 210, the second redistribution line 220 and the fifth redistribution line 230 are connected to the first semiconductor chip 120 by the bonding pads 152. On the other hand, the third and fourth redistribution lines 240 and 250 are not electrically connected to the first semiconductor chip 120. Instead, and although not shown, the third and fourth redistribution lines 240 and 250 are connected to active or passive elements, for example, capacitors, via the bonding pads 158.

The third and fourth redistribution lines 240 and 250 may be power lines or ground lines. If the third redistribution line 240 is a power line, the fourth redistribution line 250 may be a ground line. In addition, the third and fourth redistribution lines 240 and 250 may extend parallel to one another and to at least part of a signal line, for example, at least part of the fifth redistribution line 230.

A first redistribution wire 214 is disposed on the first semiconductor chip 120 and electrically connects respective ones of the plurality of redistribution lines 200 to one another.

In this embodiment, first redistribution wires 214 connect a plurality 210a, 210b and 210c of the first redistribution lines 210 to each other, and are not electrically connected to any of the second to fifth redistribution lines 220 to 250. To this end, the first redistribution wires 214 may be bonding wires. Alternatively, the redistribution wires 214 may be formed above the level of the redistribution lines 200 by etching or other convention patterning processes or the like. In addition, a connection pad 212 may be formed on each first redistribution line 210 to facilitate the electrical connection of the first redistribution wires 214 to the first redistribution lines 210.

The first redistribution wires 214 may extend lengthwise each in a direction, e.g., the first direction, across the direction in which each of the first redistribution lines 210 runs. In the example shown best in FIG. 3, parts of the first redistribution lines 210a, 210b and 210c extend in the second direction, and a respective second redistribution line 220 and a fifth redistribution line 230 interposed between adjacent ones of the first redistribution lines 210a, 210b and 210c extend parallel to the first redistribution lines 210a, 210b and 210c. In addition, the first redistribution wires 214 may directly electrically connect the first redistribution lines 210a, 210b and 210c to each other.

Figure 4:
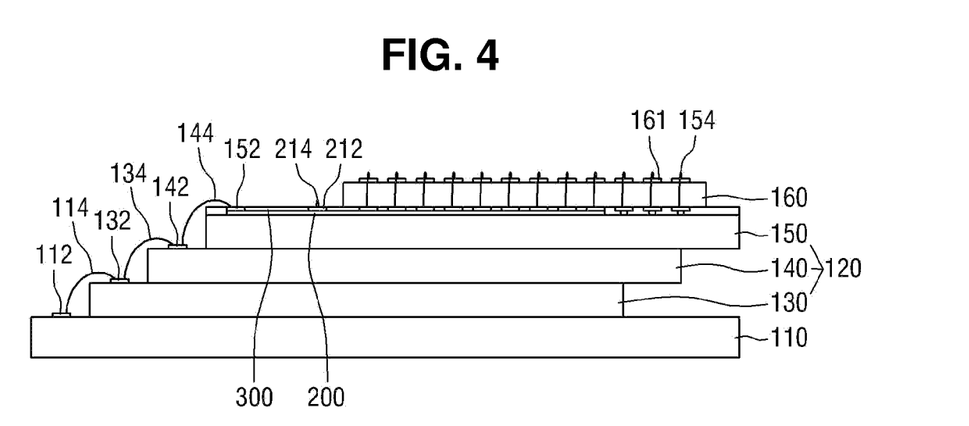

Referring to FIG. 4, the multi-chip semiconductor package may also include an insulating layer 300 on the first semiconductor chip 120. The insulating layer 300 may cover the redistribution lines 200. In this case, the redistribution lines 200 can be protected from external surroundings, and shorts between the redistribution lines 200 can be prevented. However, in this example, the insulating layer 300 does not cover the connection pads 212 because the connection pads 212 are electrically connected at their top surfaces to the first redistribution wires 214. Lateral surfaces of the connection pads 212, on the other hand, may be shielded from the outside by the insulating layer 300.

Accordingly, the power voltage may be supplied to the first semiconductor chip 120 in a secured manner. And due to electrical the connection of the first redistribution lines 210a, 210b and 210c to one another by the first redistribution wires 214, the resistance and inductance of the first redistribution lines 210a, 210b and 210c are lower than in a hypothetical case in which the first redistribution lines 210a, 210b and 210c are not connected to each other. Therefore, a first voltage, e.g., a power voltage, may be supplied to the first semiconductor chip 120 without power loss. Furthermore, without the redistribution wires 214, the phase and magnitude of the power voltage supplied to the first semiconductor chip 120 using each of the first redistribution lines 210a, 210b and 210c would differ due to differences in the thicknesses and/or lengths of the first redistribution lines 210a, 210b and 210c. On the contrary, though, the first redistribution lines 210a, 210b and 210c are electrically connected to each other by the first redistribution wires 214 so that a constant, stable power voltage may be supplied to the first semiconductor chip 120.

In addition, a return current path can be secured by the first redistribution wires 214. Therefore, the resistance, inductance and EMI noise of the first redistribution line 210, the second redistribution line 220 transmitting a ground voltage, and the third redistribution line 250 transmitting a signal, may be reduced.

A second embodiment of a semiconductor package according to the present inventive concept will be described with reference to FIG. 5. Mainly only features/aspects of this (and all additional embodiments) which are different than those of the embodiment of FIGS. 1-4 will be described in detail, for the sake of brevity.

Figure 5:
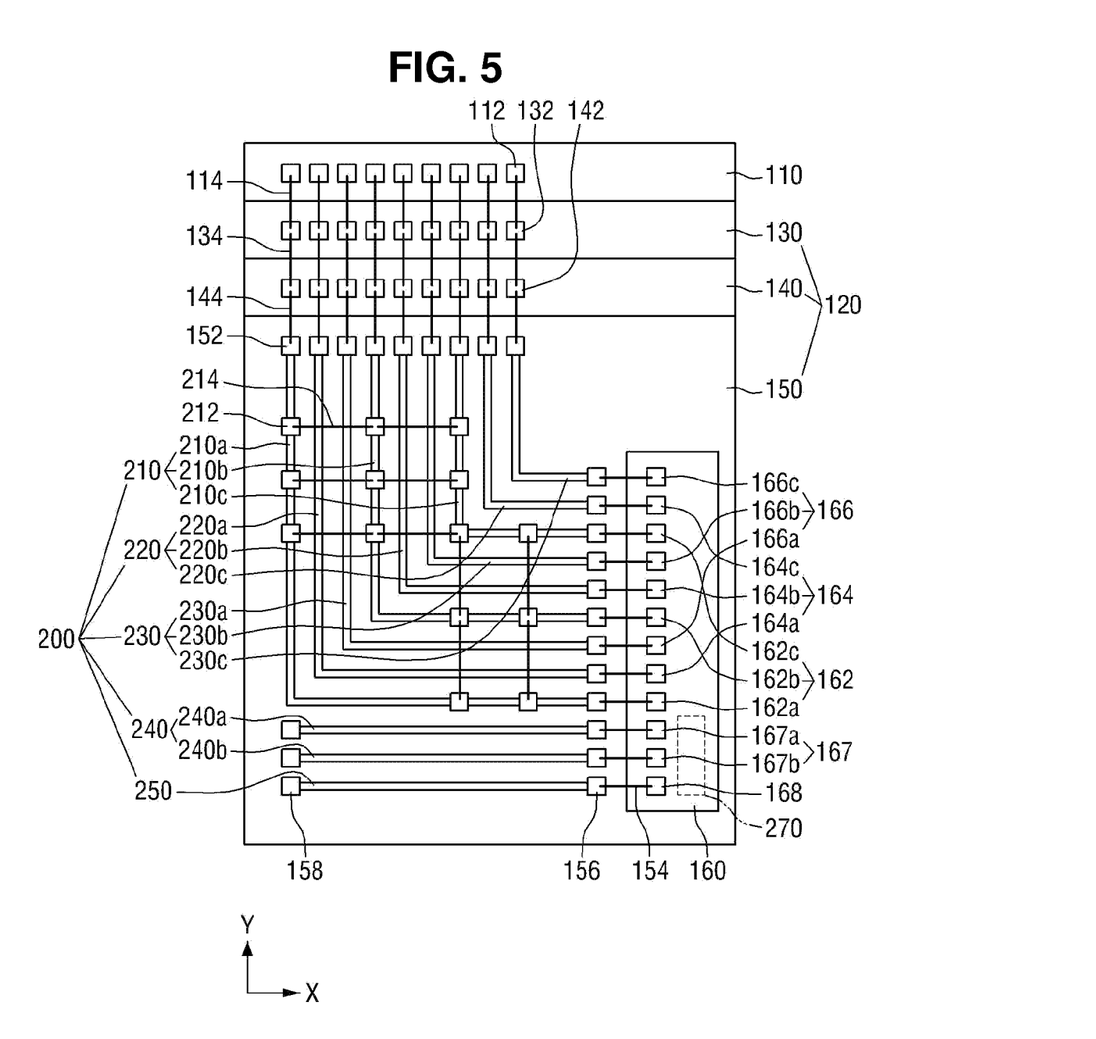
FIG. 5 is a plan view of a second embodiment of a semiconductor package according to the present inventive concept.

In the embodiment of FIG. 5, a plurality of set of the connection pads 212 are provided on the top surfaces of the first redistribution lines 210. Thus, first redistribution wires 214 may connect the same ones of the first redistribution lines 210 multiple times to one another. Even more specifically, a plurality of connection pads 212 are disposed on each of the first redistribution lines 210a, 210b and 210c (e.g., five connection pads 212 disposed on and spaced along second redistribution line 210a, five connection pads 212 disposed on and spaced along second redistribution line 210b, and four connection pads 212 disposed on and spaced along second redistribution line 210c).

Also, the first redistribution lines 210 extend not only in the first (e.g., x) direction but also in the second (e.g., y) direction. Furthermore, whereas one or more of the connection pads 212 are disposed on part of a first redistribution line running in the first direction, at least one other connection pad 212 is disposed on part of the first redistribution that runs in the second direction. Therefore, some of the first redistribution wires 214 may also extend in the second direction while others of the first redistribution wires 214 run in the first direction. More specifically, the first redistribution wires 214 disposed over those parts of the first redistribution lines 210 running in the first direction extend in the second direction, and the first redistribution wires 214 disposed over those parts of the first redistribution lines 210 running in the second direction extend in the first direction. Therefore, the first redistribution lines 210 and the first redistribution wires 214 cross each other.

Figure 6:
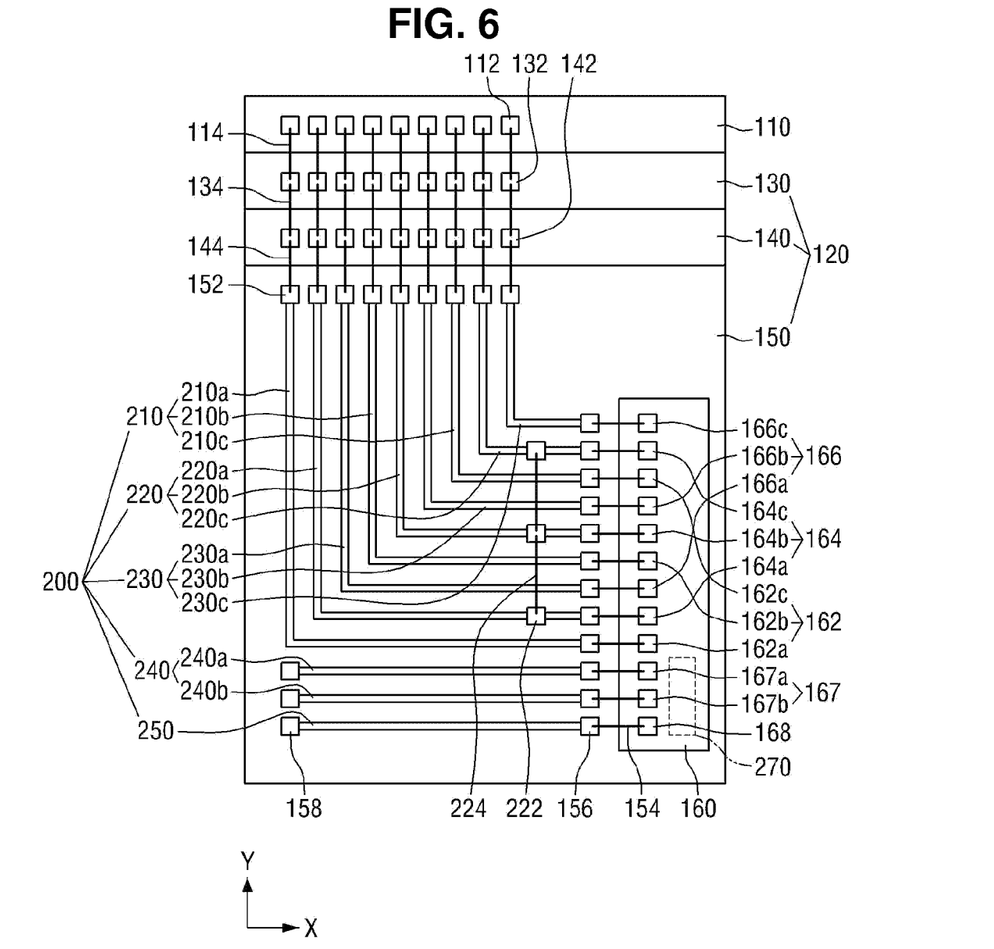
FIG. 6 is a plan view of a third embodiment of a semiconductor package according to the present inventive concept.

A third embodiment of a semiconductor package according to the present inventive concept will be described with reference to FIG. 6.

In this embodiment, second redistribution lines 220 are connected to each other in the semiconductor package. For example, second redistribution lines 220a, 220b and 220c are connected to each other by second redistribution wires 224. To this end, a connection pad 222 is formed on each of the second redistribution lines 220a, 220b and 220c, and the second redistribution wires 224 are wire bonded to the connection pads 222. Furthermore, although the second redistribution wires 224 connect the second redistribution lines 220a, 220b and 220c to each, the second redistribution wires 224 are not connected to the first redistribution lines 210 and the fifth redistribution lines 230.

The second redistribution wires 224 extend cross-wise with respect to the second redistribution lines 220. More specifically, in the illustrated example, the second redistribution wires 224 extend in the second direction over parts of the second redistribution lines 220 which run in the first direction.

Accordingly, a ground voltage may be supplied to the first semiconductor chip 120 in a more secured manner. And due to electrical the connection of the second redistribution lines 220a, 220b and 220c to one another by the second redistribution wires 224, the resistance and inductance of the second redistribution lines 220a, 220b and 220c are lower than in a hypothetical case in which the second redistribution lines 220a, 220b and 220c are not connected to each other. Therefore, the ground voltage may be supplied to the first semiconductor chip 120 without power loss. Furthermore, without the redistribution wires 224, the phase and magnitude of the ground voltage supplied to the first semiconductor chip 120 using each of the second redistribution lines 220a, 220b and 220c would differ due to differences in the thicknesses and/or lengths of the second redistribution lines 220a, 220b and 220c. On the contrary, though, the second redistribution lines 210a, 210b and 210c are electrically connected to each other by the second redistribution wires 224 so that a constant, stable ground voltage may be applied to the first semiconductor chip 120.

Figure 7:
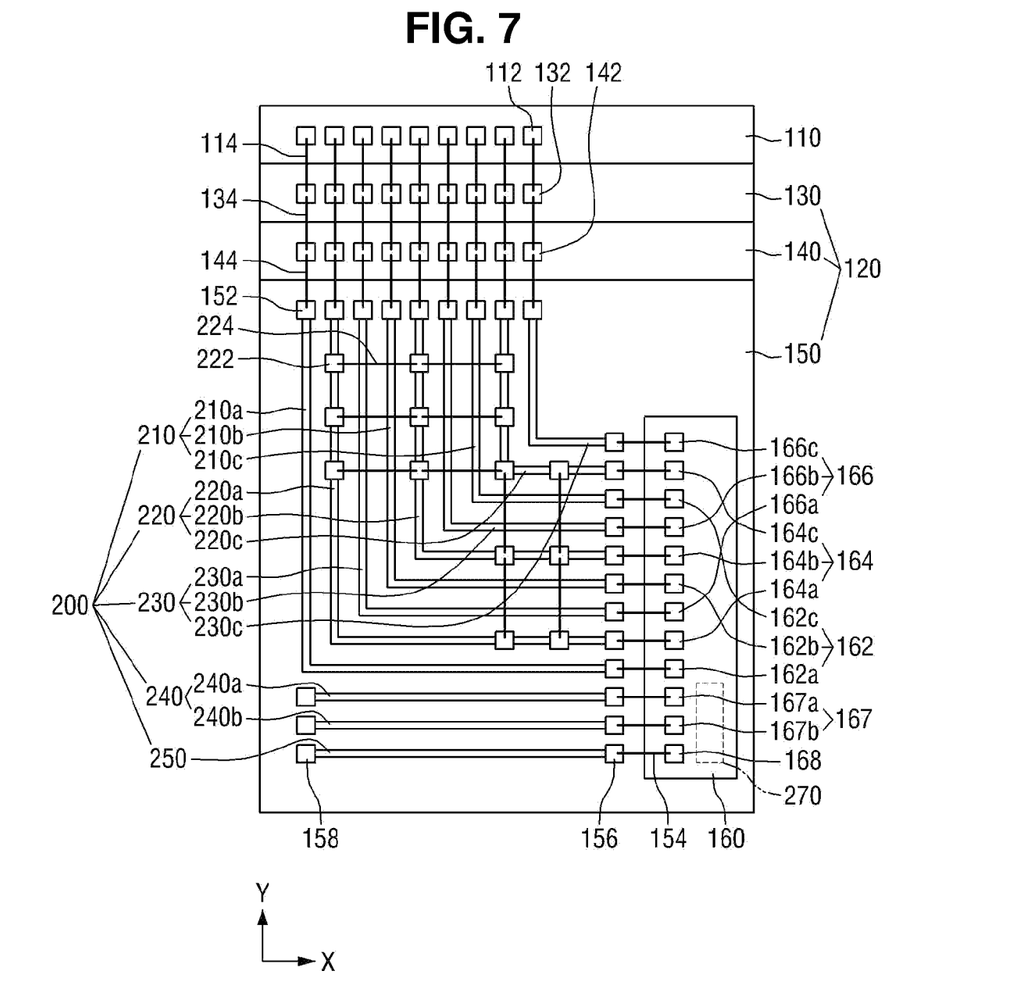
FIG. 7 is a plan view of a fourth embodiment of a semiconductor package according to the present inventive concept.

A fourth embodiment of a semiconductor package according to the present inventive concept will be described with reference to FIG. 7.

In this embodiment, a plurality of set of the connection pads 222 are provided on the top surfaces of the second redistribution lines 220. Thus, second redistribution wires 224 may connect the same ones of the second redistribution lines 220 multiple times to one another. Even more specifically, a plurality of connection pads 222 are disposed on each of the second redistribution lines 220a, 210b and 210c (e.g., five connection pads 222 disposed on and spaced along second redistribution line 220a, five connection pads 222 disposed on and spaced along second redistribution line 220b, and four connection pads 222 disposed on and spaced along second redistribution line 220c).

Reference may be had to the description of the embodiment of FIG. 5 for further description as the layout of the connection pads 222 on the second distribution wires 220 in this embodiment is similar to the layout of the connection pads 212 on the first distribution wires 210 in the embodiment shown in and described with reference to FIG. 5.

Figure 8:
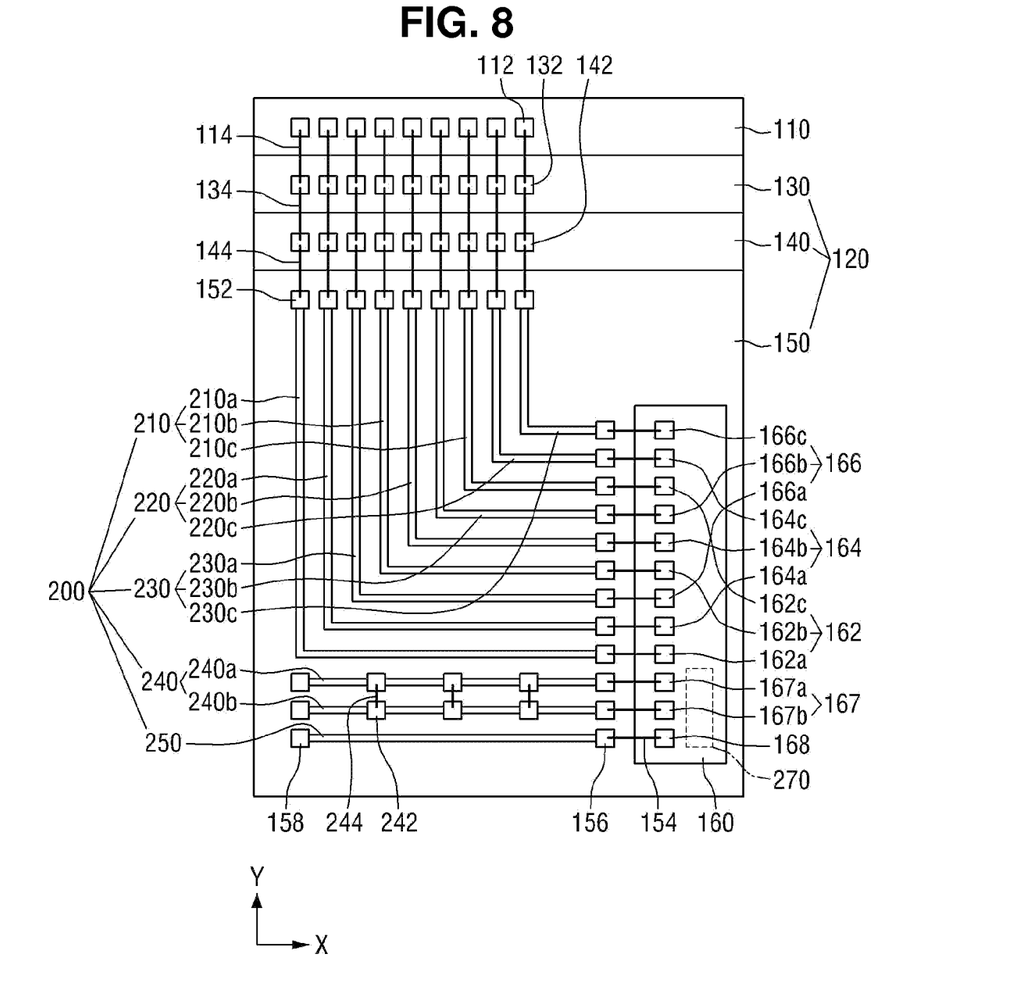
FIG. 8 is a plan view of a fifth embodiment of a semiconductor package according to the present inventive concept.

A fifth embodiment of a semiconductor package according to the present inventive concept will now be described with reference to FIG. 8.

In this embodiment, third redistribution lines 240a and 240b connected to a voltage regulator 270 of the second chip 160 (via ground pad unit 167) are electrically connected to one another by third redistribution wires 244. To this end, connection pads 242 are disposed on each of the third redistribution lines 240a and 240b, and the connection pads 242 and the third redistribution wires 244 are wire bonded to each other.

The third redistribution wires 244 extend cross-wise relative to the third redistribution lines 240a and 240b. For example, the third redistribution wires 244 may extend in the second direction on the third redistribution lines 240a and 240b extending in the first direction.

As mentioned above, the voltage regulator 270 of the second semiconductor chip 160 regulates a voltage supplied to the second semiconductor chip 160 and supplies a constant voltage to the first semiconductor chip 120. In order to supply a constant voltage to the first semiconductor chip 120, a ground voltage of the voltage regulator 270 should not be swayed, and the ground voltage of the voltage regulator 270 should not differ among the respective voltage regulator ground pads 167a and 167b. The third redistribution lines 240a and 240b will have a common ground voltage because the third redistribution lines 240a and 240b are electrically connected to one another by the third redistribution wires 244. Therefore, the resistance and inductance of each of the third redistribution lines 240a and 240b may be minimized.

Also, in the illustrated embodiment, the third redistribution line 240 and the fourth redistribution line 250 supply ground voltages, but the present inventive concept is not so limited. In another example of this embodiment, the third redistribution line 240 supplies a ground voltage, and the fourth redistribution line 250 supplies a power voltage to the second semiconductor chip 160 for driving the second semiconductor chip 160.

In the illustrated embodiment as well, the third redistribution line 240 and the fourth redistribution line 250 are located laterally of (outside) the entire collection of first, second and fifth redistribution lines 210, 220 and 230, but the present inventive concept again is not so limited. Rather, the third and fourth redistribution lines 240 and 250 may be interposed between adjacent ones of the first redistribution line 210, the second redistribution line 220 and the fifth redistribution line 230.

Furthermore, in this example, the third redistribution lines 240a and 240b are connected multiple times by the third distribution wires 244. That is, a plurality of connection pads 242 are disposed on and spaced along the length of each of the third redistribution lines 240, and a respective third distribution wire 244 is wire bonded to the connection pads 242 disposed on two of the third redistribution lines 240, respectively.

A sixth embodiment of a semiconductor package according to the present inventive concept will be described with reference to FIG. 9.

In this embodiment, a second redistribution line 220, a third redistribution line 240, and a fourth redistribution line 250 are connected to each other. For example, second redistribution lines 220a, 220b and 220c are electrically connected to each other by second redistribution wires 224, third redistribution lines 240a and 240b are electrically connected to each other by third redistribution wires 244, the second redistribution line 220c and the third redistribution line 240a are electrically connected to each other by fourth redistribution wires 246, and the third redistribution line 240b and the fourth redistribution line 250 are electrically connected to each other using fifth redistribution wires 254.

As described above, a fifth redistribution wire 254 connects the fourth redistribution line 250 to the third redistribution line 240b. Alternatively, i.e., in other examples of this embodiment, the fifth redistribution wire 254 connects the fourth redistribution line 250 to a second redistribution line 220 or fifth redistribution wires 254 connect the fourth redistribution line 250 to the second and third redistribution lines 220 and 240, respectively.

As was described above, the second redistribution line 220, the third redistribution line 240 and the fourth redistribution line 250 are connected to an output ground pad unit 164, a power regulator ground pad unit 167 and a second semiconductor chip ground pad unit 168, respectively. The fifth redistribution wires 254 thus in effect generally reduce the resistance and inductance of each of the second redistribution line 220, the third redistribution line 240 and the fourth redistribution line 250. As a result, a common ground voltage is supplied by the second redistribution line 220, the third redistribution line 240 and the fourth redistribution line 250. Accordingly, the designing of the semiconductor package does not have to take into account differences in the redistribution lines that would otherwise result in different (variations among the) ground voltages being supplied in the package from one chip to another.

Figure 10:
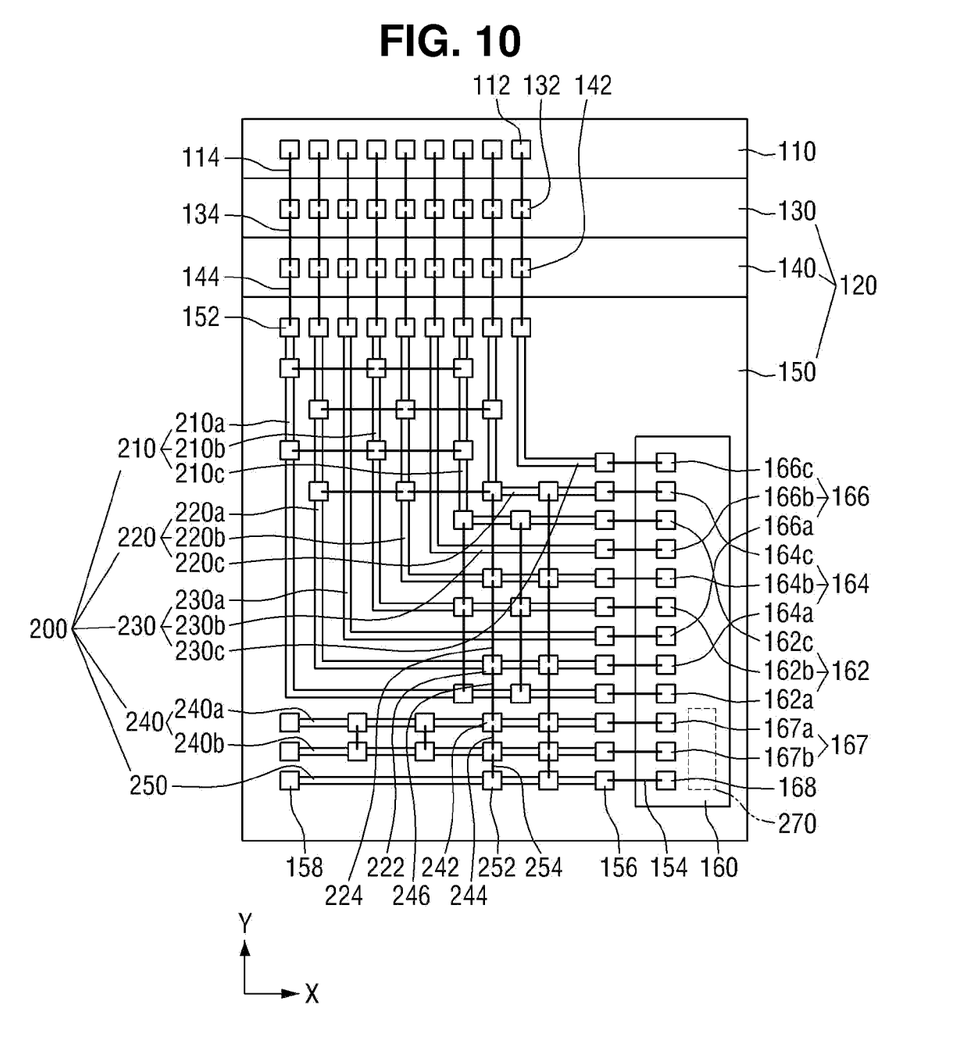
FIG. 10 is a plan view of a seventh embodiment of a semiconductor package according to the present inventive concept.

A seventh embodiment of a semiconductor package according to the present inventive concept will be described with reference to FIG. 10.

Figure 9:
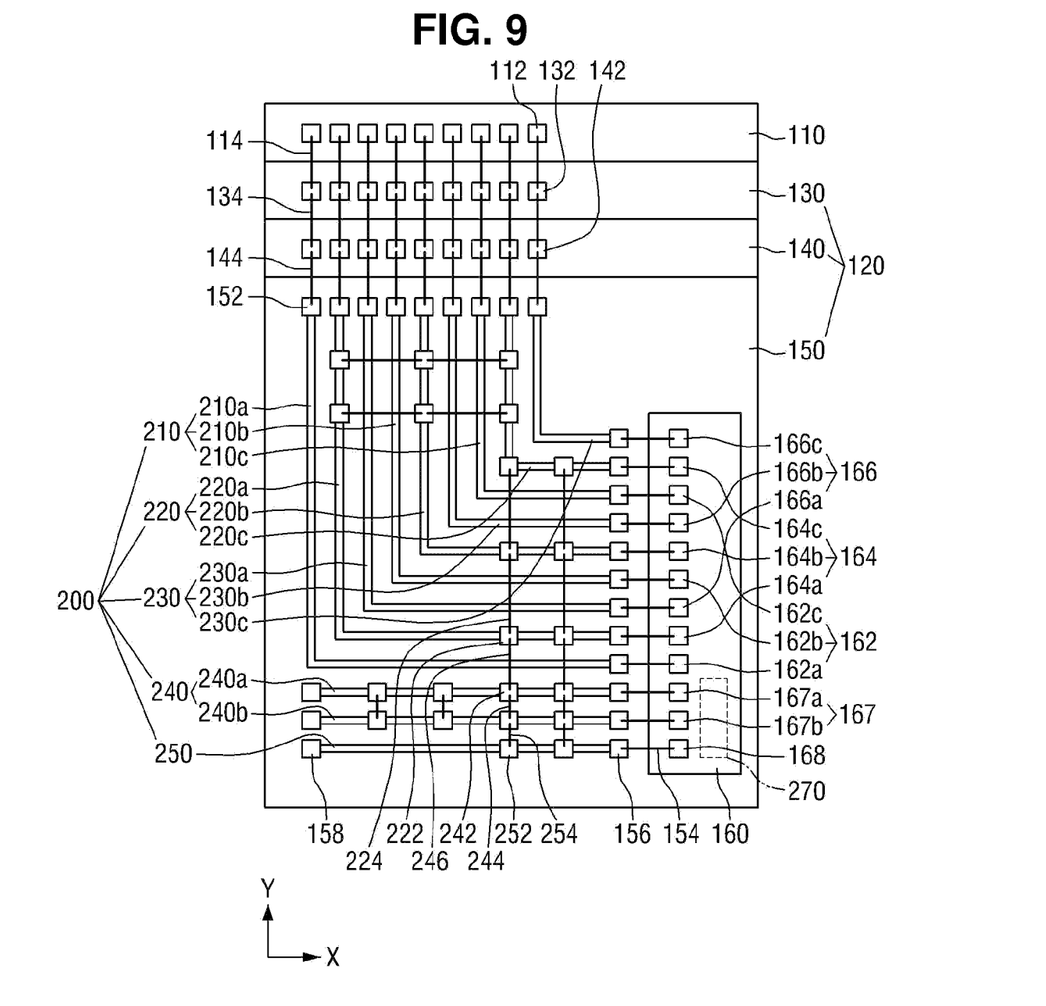
FIG. 9 is a plan view of a sixth embodiment of a semiconductor package according to the present inventive concept.

The seventh embodiment of the semiconductor package may be a combination of the above-described second and sixth embodiments and reference may thus be made to the detailed descriptions of FIGS. 5 and 9. Briefly, though, in this embodiment, first redistribution lines 210a, 210b and 210c are connected to supply a common power voltage to the first semiconductor chip 120. The second to fourth redistribution lines 220, 240 and 250 are connected to allow the first semiconductor chip 120, the second semiconductor chip 160 and a voltage regulator 270 of the second semiconductor chip 160 to share a common ground voltage. Thus, the power voltage and ground voltage can be supplied in a secured manner, thereby improving the reliability of the semiconductor package.

Next, examples of applications of semiconductor packages according to the inventive concept will be described with reference to FIGS. 11 and 12.

Figure 11:
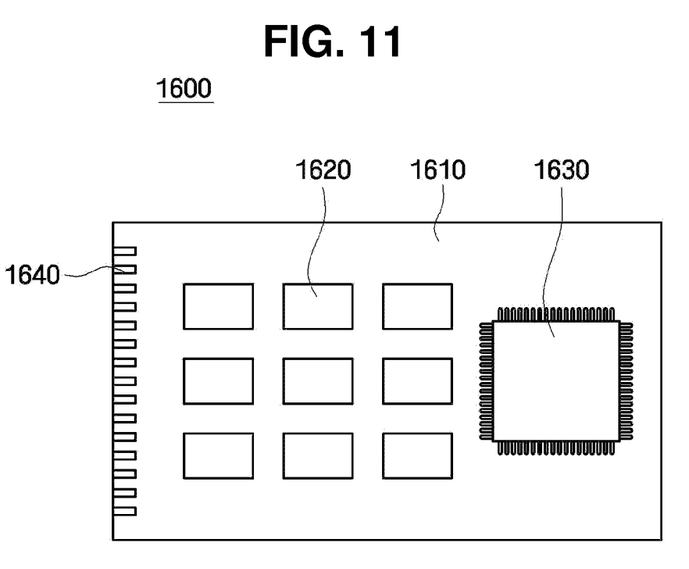
FIGS. 11 and 12 each illustrate an example of an application of a semiconductor package according to the present inventive concept.

Referring first to FIG. 11, one application is a package module 1600. The package module 1600 may include a substrate 1610 having external connection terminals 1640, a semiconductor integrated circuit chip 1620 mounted on the substrate 1610, and a Quad Flat Package (QFP) 1630 also mounted on the substrate 1610 and including a semiconductor integrated circuit chip. The package module 1600 may be connected to an external electronic device through an external connection terminal 1640. In this type of package module, multiple chips according to the inventive concept may be substituted for the semiconductor integrated circuit chip 1620 on the substrate 1610 and/or the Quad Flat Package (QFP) 1630 may comprise a multi-chip package according to the inventive concept.

Figure 12:
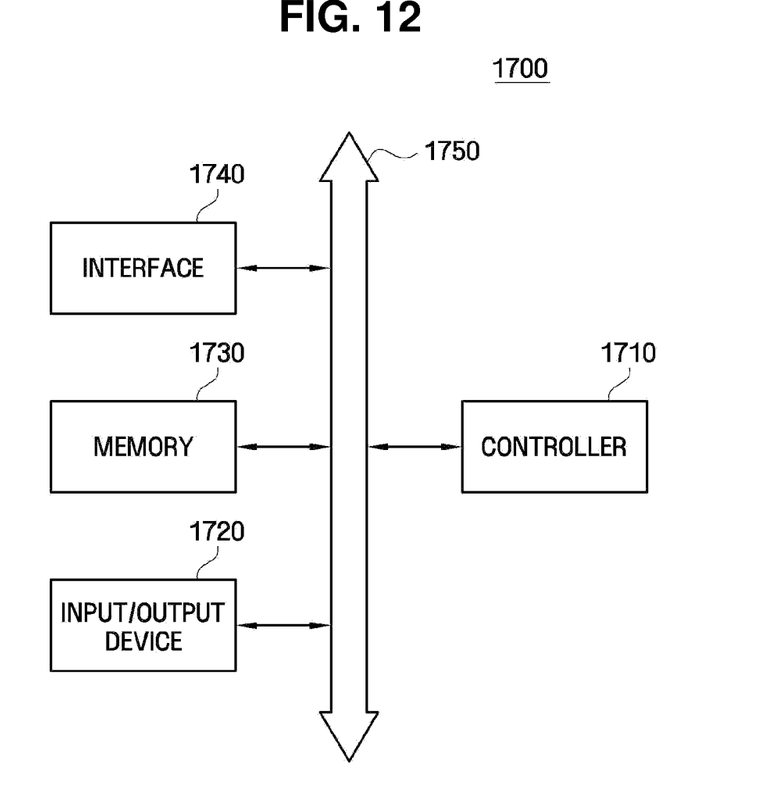

Referring to FIG. 12, another application is an electronic system 1700. The electronic system 1700 may include a controller 1710, an input/output device 1720, and a storage device 1730, which are connected through a bus 1750 providing a path along which data are transferred.

The controller 1710 may include, for example, at least one microprocessor, a digital signal processor, a microprocessor, and at least one logic device performing similar operations to the processors.

The input/output device 1720 may include at least one of a keypad, a keyboard, and a display device. In particular, in a case where the electronic system 1700 is a system associated with image processing, an externally input image may be transmitted to the controller 1710 through the input/output device 1720.

The storage device 1730 may include a volatile memory such as a DRAM and/or a non-volatile memory device such as a flash memory. The flash memory may be mounted in, for example, an information processing system of a mobile appliances or desktop computer. The flash memory may include a solid-state drive (SSD) such that the electronic system 1700 is capable of reliably storing a massive amount of data.

At least one of the controller 1710, the input/output device 1720 and the storage device 1730 may comprise a semiconductor package according to the inventive concept.

The electronic system 1700 may further include an interface 1740 for transmitting/receiving data to/from a communication network. The interface 1740 may be a wired interface or a wireless interface.

The interface 1740 may include, for example, an antenna, a wired or wireless transceiver, or the like. The electronic system 1700 may be further provided with an application chipset, a camera image processor (CIS), or an input/output device.

An electronic system 1700 of the types described above may generally or more specifically constitute a mobile system, a personal computer (PC), a laptop computer, a portable computing device, an industrial computer, or a logic system capable of executing various functions. Specific examples of the electronic system 1700 include a personal digital assistant (PDA), a web tablet, a mobile phone, a laptop computer, a memory card, and a digital music system (MP3 player, for example). The electronic system 1700, if embodied as an apparatus for executing radio and/or cellular communications, may be used in communication systems such as CDMA (Code Division Multiple Access), GSM (Global System for Mobile communication), NADC (North American Digital Cellular), E-TDMA (Enhanced-Time Division Multiple Access), WCDMA (Wideband Code Division Multiple Access), and CDMA2000 systems.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A semiconductor package comprising:
   at least one first semiconductor chip disposed on a substrate;
   a second semiconductor chip disposed on the at least one first semiconductor chip;
   redistribution lines extending on the at least one first semiconductor chip and providing conductive paths, respectively, each of which paths electrically connects the first semiconductor chip to the second semiconductor chip independently of the other; and
   at least one redistribution wire disposed on the at least one first semiconductor chip and electrically connecting a plurality of the redistribution lines to one another.

2. The semiconductor package of claim 1, wherein the at least one first semiconductor chip comprises a memory chip, and the second semiconductor chip includes a controller controlling the memory chip.

3. The semiconductor package of claim 1, further comprising pads of electrically conductive material disposed on top surfaces of the redistribution lines, and wherein the at least one redistribution wire is electrically connected to the redistribution lines via the pads.

4. The semiconductor package of claim 3, wherein the at least one redistribution wire includes a plurality of distribution wires, the pads are disposed on top surfaces of the redistribution lines, respectively, and each of the redistribution wires is directly connected to a respective pair of the pads.

5. The semiconductor package of claim 3, further comprising an insulation film disposed on the first semiconductor chip, covering the redistribution lines and exposing a top surface of each of the pads.

6. The semiconductor package of claim 1, wherein the at least one first semiconductor chip comprises a plurality of first semiconductor chips, and the conductive paths provided by the redistribution lines electrically connect each of the first semiconductor chips to the second semiconductor chip.

7. The semiconductor package of claim 1, wherein the redistribution lines include a plurality of first redistribution lines providing a first voltage output from the second semiconductor chip to the first semiconductor chip, and the at least one redistribution wire comprises a first redistribution wire electrically connecting one of the first redistribution lines to another of the first redistribution lines.

8. The semiconductor package of claim 7, wherein the second semiconductor chip includes a power output pad unit and an output ground pad unit, and the power output pad unit is electrically connected to the first redistribution lines to supply the power voltage to the first semiconductor chip.

9. The semiconductor package of claim 7, wherein the redistribution lines include a plurality of second redistribution lines supplying a second voltage output from the second semiconductor chip and different from the first voltage to the first semiconductor chip, and the at least one redistribution wire comprises a second redistribution wire electrically connecting one of the second redistribution lines to another of the second redistribution lines.

10. The semiconductor package of claim 9, wherein the second semiconductor chip further includes a voltage regulator and a voltage regulator ground pad unit electrically connected to the voltage regulator, the redistribution lines further include a plurality of third redistribution lines electrically connected to the voltage regulator ground pad unit, and the at least one redistribution wire comprises a third redistribution wire electrically connecting one of the third redistribution lines to another of the third redistribution lines.

11. The semiconductor package of claim 10, wherein the at least one redistribution wire comprises a fourth redistribution wire electrically connecting the second redistribution line to the third redistribution line.

12. The semiconductor package of claim 11, wherein the second semiconductor chip further includes a second semiconductor chip ground pad unit, the redistribution lines further include a fourth redistribution line electrically connected to the second semiconductor chip ground pad unit, and the at least one redistribution wire comprises a fifth redistribution wire connecting the fourth redistribution line to the second redistribution line and/or the third redistribution line.

13. A semiconductor package comprising:
a first semiconductor chip disposed on a substrate;
a second semiconductor chip disposed on the first semiconductor chip;
redistribution lines each disposed on the first semiconductor chip; and
redistribution wires disposed on the first semiconductor chip and electrically connecting respective ones of the redistribution lines to one another,
wherein the redistribution lines include a plurality of first redistribution lines electrically connecting the first semiconductor chip to the second semiconductor chip to supply a first voltage to the first semiconductor chip, a plurality of second redistribution lines electrically connected to the second semiconductor chip to supply the first voltage to the second semiconductor chip, and a plurality of third redistribution lines electrically connected to the second semiconductor chip to supply the first voltage to the second semiconductor chip,
the redistribution wires include a first redistribution wire electrically connecting one of the first redistribution lines to another of the first redistribution lines, a second redistribution wire electrically connecting one of the second redistribution lines to another of the second redistribution lines, and third redistribution wires electrically connecting the first redistribution line, the second redistribution line and the third redistribution line to one another.

14. The semiconductor package of claim 13, wherein the first voltage is a ground voltage.

15. The semiconductor package of claim 13, wherein the second semiconductor chip includes an output ground pad unit, a voltage regulator, a voltage regulator ground pad electrically connected to the voltage regulator, and a second semiconductor chip ground pad, the first redistribution line is electrically connected to the output ground pad, the second redistribution line is electrically connected to the voltage regulator ground pad, and the third redistribution line is electrically connected to the second semiconductor chip ground pad.

16. A multi-chip semiconductor device comprising:
a first semiconductor chip including a first chip body having an upper surface at the top of the device;
a second semiconductor chip stacked on the first semiconductor chip so as to also be located at the top of the device, the second semiconductor chip including a second chip body adhered to the first chip body;
redistribution lines extending over the upper surface of the first chip body, the redistribution lines providing conductive paths, respectively, each of which paths electrically connects the first semiconductor chip to the second semiconductor chip independently of the other; and
at least one redistribution wire running alongside the upper surface of the first chip body, each said at least one redistribution wire electrically connecting two of the redistribution lines to one another.

17. The semiconductor device of claim 16, wherein the second semiconductor chip has a smaller footprint than that of the first semiconductor chip, and is disposed within the bounds of the upper surface of the first chip body, the first semiconductor chip has electrically conductive pads on the upper surface of the first chip body, the second semiconductor chip has electrically conductive pads on the upper surface of the second chip body, and further comprising bonding wires each of which is bonded to the first semiconductor chip at a respective one of the pads of the first semiconductor chip and to the second semiconductor chip at a respective one of the pads of the second semiconductor chip.

18. The semiconductor device of claim 16, wherein the first semiconductor chip has electrically conductive pads on the upper surface of the first chip body, each said at least one redistribution wire is bonded to the first semiconductor chip at each of two of the pads of the first semiconductor chip, and said two of the pads are each disposed intermediate the ends of a respective one of the two redistribution lines electrically connected to one another by the redistribution wire.

19. The semiconductor device of claim 16, wherein the second semiconductor chip has electrically conductive pads on a surface of the second chip body, the second semiconductor chip has a voltage source, a group of the pads of the second semiconductor chip are electrically connected to the voltage source, and the redistribution lines connected to each other by the redistribution wire are respectively electrically connected to the pads of said group.

20. The semiconductor device of claim 16, wherein the at least one redistribution wire comprises two redistribution wires each of which electrically connects the same two redistribution lines to one another as the other.

* * * * *